United States Patent
Moon et al.

(10) Patent No.: US 8,710,587 B2
(45) Date of Patent: Apr. 29, 2014

(54) LATERAL DOUBLE DIFFUSED METAL OXIDE SEMICONDUCTOR DEVICE AND METHOD OF MANUFACTURING THE SAME

(75) Inventors: Nam-Chil Moon, Seoul (KR); Jae-Hyun Yoo, Seoul (KR); Jong-Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 143 days.

(21) Appl. No.: 13/275,603

(22) Filed: Oct. 18, 2011

(65) Prior Publication Data
US 2012/0292698 A1 Nov. 22, 2012

(30) Foreign Application Priority Data
May 16, 2011 (KR) .................. 10-2011-0045755

(51) Int. Cl.
*H01L 29/78* (2006.01)
*H01L 21/336* (2006.01)
*H01L 29/06* (2006.01)

(52) U.S. Cl.
CPC ........ *H01L 29/7816* (2013.01); *H01L 29/0619* (2013.01)
USPC .............. 257/339; 257/E21.424; 257/E29.12; 257/335; 438/286; 438/400; 438/420; 438/298

(58) Field of Classification Search
CPC .............. H01L 29/063; H01L 29/0619; H01L 29/7801; H01L 29/7816; H01L 29/402; H01L 29/4175
USPC .................. 257/E21.418, E21.409, E21.424, 257/E29.12, E29.256, 335, 339, 342, 343; 438/197, 233, 268, 400
See application file for complete search history.

(56) References Cited

U.S. PATENT DOCUMENTS

| | | | |
|---|---|---|---|
| 2002/0137268 A1* | 9/2002 | Pellerin et al. ................. | 438/197 |
| 2003/0025154 A1* | 2/2003 | Haynie ......................... | 257/335 |
| 2008/0185666 A1* | 8/2008 | Yoo et al. ...................... | 257/408 |
| 2008/0197410 A1* | 8/2008 | Chiang et al. ................. | 257/342 |
| 2009/0263947 A1 | 10/2009 | Hebert | |

FOREIGN PATENT DOCUMENTS

KR 10-2010-0063576 6/2010

OTHER PUBLICATIONS

Nam-Chil Moon et al., "Design and Optimization of Double-RESURF 700V Lateral Device", Feb. 17, 2011.

* cited by examiner

*Primary Examiner* — Tom Thomas
*Assistant Examiner* — John Bodnar
(74) *Attorney, Agent, or Firm* — Sherr & Jiang, PLLC

(57) ABSTRACT

An LDMOS device includes a gate which is formed on and/over over a substrate; a source and a drain which are arranged to be separated from each other on both sides of the substrate with the gate interposed therebetween; and a field oxide film formed to have a step between the gate and the drain. The LDMOS device further includes a drift region formed of first conduction type impurity ions between the gate and the drain in the substrate; and at least one internal field ring formed in the drift region by selectively implanting a second conduction type impurity in accordance with the step of the field oxide film.

10 Claims, 4 Drawing Sheets

US 8,710,587 B2

LATERAL DOUBLE DIFFUSED METAL OXIDE SEMICONDUCTOR DEVICE AND METHOD OF MANUFACTURING THE SAME

The present application claims priority to Korean Patent Application No. 10-2011-0045755 (filed on May 16, 2011), which is hereby incorporated by reference in its entirety.

BACKGROUND

LDMOS transistors which are high-voltage power devices have the advantages of a fast switching speed, high input impedance, low power consumption, compatibility a CMOS process, and the like, and is widely used for various power devices such as a display driving IC, a power converter, a motor controller, and a power supply for a vehicle. In the case of power devices, specific on-resistance and breakdown voltage are important factors which significantly affect the performance of such devices. Accordingly, various techniques for increasing the breakdown voltage while maintaining specific on-resistance have been suggested.

Of these suggested techniques, a structure is known in which an internal field ring is formed below the end portion of the gate in the drift region of the LDMOS transistor using a dopant having an opposite type to the drift region.

The breakdown voltage characteristic of the semiconductor device is closely related with the radius of curvature of the source region or the drain region. In particular, the radius of curvature of the source region which is relatively small is one of the important factors for the reduction in the breakdown voltage of the device. As well known in the related art, this is because a phenomenon occurs in which an electric field concentrates on the junction region having a small radius of curvature.

Figure 1:
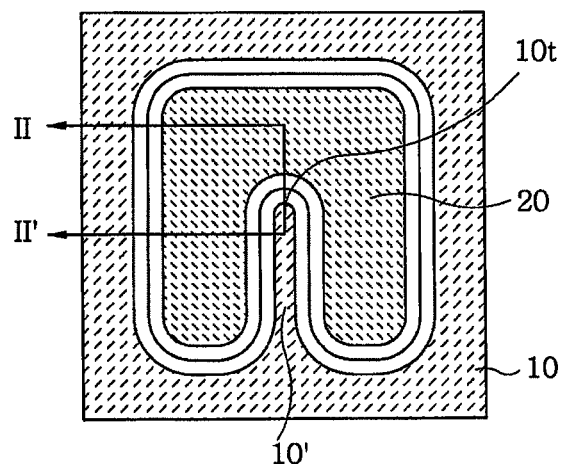
FIG. 1 illustrates a layout diagram showing a power semiconductor device of the related art, for example, an LDMOS transistor.
Figure 2:
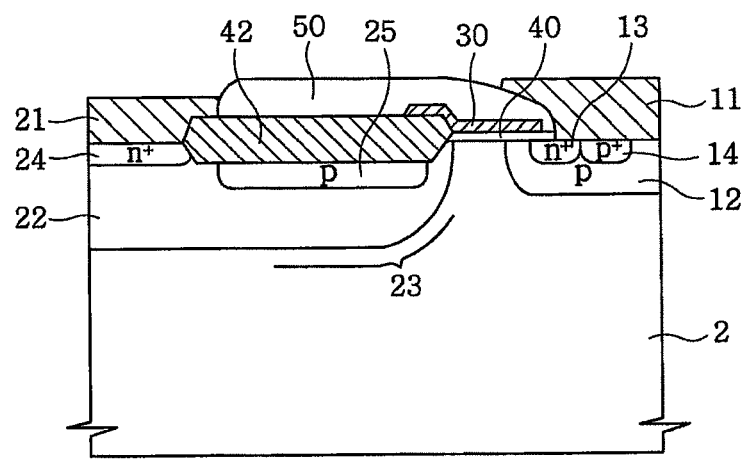
FIG. 2 illustrates a cross sectional view taken along the line II-II' of FIG. 1. The same reference numerals of FIGS. 1 and 2 represent the same regions or layers.

As illustrates in FIGS. 1 and 2, the LDMOS transistor of the related art has a protrusion 10' in a line segment shape or cross-section in a central portion thereof, and includes a source structure 10 which surrounds given regions on the left and right sides and the upper side of the protrusion 10'. The LDMOS transistor includes a drain structure 20 which is formed to surround the protrusion 10' of the source structure 10. The drain structure 20 is separated from the source structure 10 at a predetermined interval.

The source structure 10 includes a source electrode 11 on the surface of a p-type semiconductor substrate 2, a p-type well region 12 formed in the semiconductor substrate 2 below the source electrode 11, and a high-concentration n+ source region 13 and a high-concentration p+ region 14 which are formed in the p-type well region 12.

The drain structure 20 includes a drain electrode 21 on the surface of the semiconductor substrate 2, and an n-type well region 22 formed in the semiconductor substrate 2 below the drain electrode 21 and used as a drift region. As shown in FIG. 2, the n-type well region 22 is connected to an n-type expanded drain structure 23 which is not covered with the drain electrode 21. The drain structure 20 also includes an n+ drain region 24 formed in the n-type well region 22. The expanded drain structure 23 includes a p-type top region 25.

The gate electrode 30 is formed to be insulated from the underlying channel region by a gate insulating film 40, and the source electrode 11, the drain electrode 21, and the gate electrode 30 are insulated from each other by an insulating interlayer 50.

The LDMOS transistor includes a field oxide film 42 having a Local Oxidation Of Silicon (LOCOS) structure.

As the factors which determine specific on-resistance and breakdown voltage of a semiconductor device having the LDMOS transistor of the related art, there are the length of the drift region and the doping concentration of the drift region. Meaning, a trade-off relationship is exhibited such that, as the length of the drift region increases, specific on-resistance and the breakdown voltage increase, and the concentration of the drift region increases, specific on-resistance and the breakdown voltage decrease. In the structure of the LDMOS transistor of the related art, therefore, it is difficult to increase the breakdown voltage without increasing specific on-resistance.

In the LDMOS transistor of the related art, the breakdown voltage particularly decreases in a tip 10t of the protrusion 10' in the source structure 10. As a method which prevents this phenomenon, the radius of curvature of the tip 10t can increase, and in this case, it is disadvantageous in that the area of the transistor increases.

As another method, there is a method which decreases the concentration of the drift region in the semiconductor substrate 2 which the field oxide film 42 is formed. In this case, however, an additional ion implantation process is needed, causing an increase in manufacturing cost of the semiconductor device.

SUMMARY

Embodiments of the invention relate to a semiconductor device and a method of manufacturing the same, and in particular, to a lateral double diffused metal oxide semiconductor (LDMOS) device which increases a breakdown voltage without causing an increase in the number of processes, and reduces specific on-resistance Rsp using a source fingertip as a channel.

In view of the problems associated with the related art, in accordance with embodiments of the invention, an LDMOS device and a method of manufacturing an LDMOS device is provided in which an internal field ring having an opposite type to the doping type of a drift region is formed through a blanket ion implantation process. Accordingly, a process for forming an ion implantation mask to simplify a process for manufacturing a semiconductor device is removed. Moreover, breakdown voltage is increased without causing a decrease in specific on-resistance.

In accordance with embodiments of the invention, an LDMOS device includes at least one of the following: a gate which formed on and/or over a substrate; a source and a drain which are arranged to be separated from each other at both sides of the substrate with the gate interposed therebetween; a field oxide film formed having a step difference between the gate and the drain; a drift region formed of first conduction type impurity ions between the gate and the drain in the substrate; and at least one internal field ring formed in the drift region by selectively implanting a second conduction type impurity in accordance with the step difference of the field oxide film.

In accordance with embodiments, the internal field ring may be formed below the field oxide film between a source fingertip portion of the source and the drain. The concentration of the drift region may be determined by the dosage amount of the second conduction type impurity ions or ion implantation energy for forming the internal field ring. Further, the field oxide film may be formed through a Local Oxidation of Silicon (LOCOS) process.

In accordance with embodiments of the invention, a method of manufacturing an LDMOS device having a source and a drain arranged to be separated from each other at both sides of a substrate with a gate interposed therebetween, the method including at least one of the following: exposing a region of the substrate to partially expose a portion where a field oxide film is formed between the gate and the drain and implanting first conduction type impurity ions into the exposed region; forming an oxide film in the exposed portion through an oxidation process; performing an impurity implantation process with the oxide film as an ion implantation mask to implant second conduction type impurity ions into the substrate exposed through the oxide film; removing the oxide film and performing a thermal process on the semiconductor substrate, into which the first and second conduction type impurity ions are implanted, to thereby form a second conduction type well connected to the drift region and at least one internal field ring in the drift region; and then forming the field oxide film on the substrate with the internal field ring formed.

In accordance with embodiments, the step of implanting the first conduction type impurity ions may include forming an insulating film on and/or over the substrate; forming a photoresist pattern on and/or over the substrate to partially expose a portion where the field oxide film is formed between the gate and the drain; patterning the insulating film exposed through the photoresist pattern and implanting the first conduction type impurity ions; and then removing the photoresist pattern.

In accordance with embodiments, the step of forming the oxide film may include performing an oxidation process using the patterned insulating film to form the oxide film.

In accordance with embodiments, the step of implanting the second conduction type impurity ions may include removing the patterned insulating film and implanting the second conduction type impurity ions through an impurity ion implantation process using the oxide film as an ion implantation mask.

In accordance with embodiments, the insulating film may be a silicon nitride.

In accordance with embodiments, the step of forming at least one internal field ring in the drift region may include forming the internal field ring below the field oxide film formed between a source fingertip portion of the source and the drain.

In accordance with embodiments, the step of implanting the second conduction type impurity ions may include controlling the dosage amount of the second conduction type impurity ions or ion implantation energy to thereby control the concentration in the drift region.

In accordance with embodiments, the step of forming the field oxide film may include forming the field oxide film may be formed through a Local Oxidation of Silicon (LOCOS) process.

In accordance with embodiments, at least one internal field ring is formed in the drift region between the source fingertip and the drain, thereby increasing a breakdown voltage without causing an increase in the radius of curvature. The source fingertip is used as a channel, thereby decreasing specific on-resistance Rsp. Moreover, the internal field ring and the field oxide film are formed in the drift region through two oxidation processes without using an additional mask to increase a breakdown voltage and specific on-resistance, thereby minimizing the number of semiconductor processes.

DRAWINGS

The above and other features of the invention will become apparent from the following description of embodiments given in conjunction with the accompanying drawings, in which:

FIG. 1 illustrates a layout diagram showing a power semiconductor device of the related art, for example, an LDMOS transistor.

FIG. 2 illustrates a sectional view taken along the line II-II' of FIG. 1.

Figure 3:
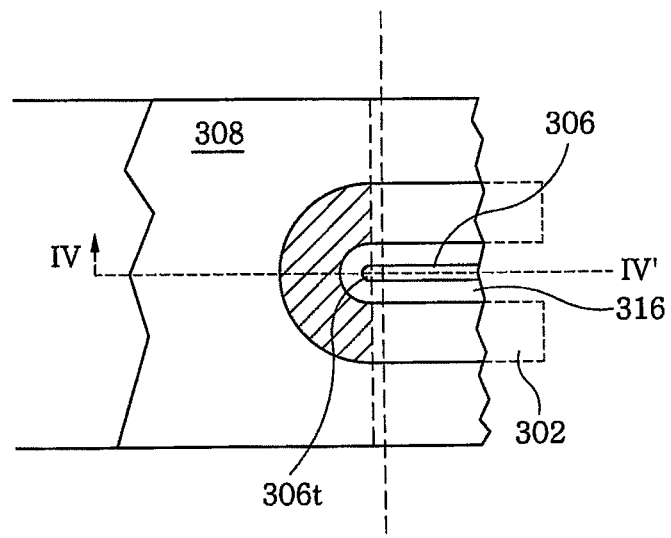

Example FIG. 3 illustrates a layout diagram showing an LDMOS device in accordance with embodiments of the invention.

Figure 4:
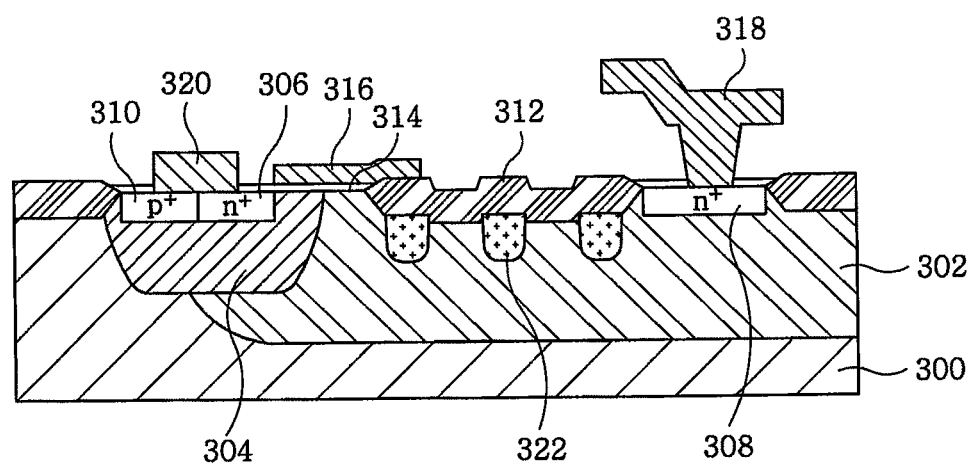

Example FIG. 4 illustrates a cross-sectional view taken along the line IV-IV' of FIG. 3, in accordance with embodiments of the invention.

Example FIGS. 5A to 5F illustrate process sectional views of a process of manufacturing an LDMOS device in accordance with embodiments of the invention.

DESCRIPTION

Embodiments of the invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, embodiments of the invention include all modifications and equivalents of the subject matter recited in the claims appended hereto as permitted by applicable law. Moreover, any combination of the above-described elements in all possible variations thereof is encompassed by embodiments of the invention unless otherwise indicated herein or otherwise clearly contradicted by context.

Hereinafter, an n-channel LDMOS transistor which has a small radius of curvature and minimizes the number of processes to increase a breakdown voltage will be described in detail with reference to the accompanying drawings.

Example FIG. 3 illustrates a layout diagram showing an LDMOS device in accordance with embodiments of the invention. Example FIG. 4 illustrates a cross-sectional view taken along the line IV-IV' of example FIG. 3. The same reference numerals in example FIGS. 3 and 4 represent the same regions or layers.

As illustrated in example FIGS. 3 and 4, an LDMOS device in accordance with embodiments of the invention includes a deep n-well 302 which is formed in a p-type or a p-type SOI substrate 300 and used as a drift region of the LDMOS device, a p-body 304 in which a channel of the LDMOS device will be formed, an n+ source 306 and an n+ drain 308, a p+ contact 310 for coming into contact with the p-body 304, a field oxide film 312, a gate oxide film 314, a gate 316 made of polysilicon or the like, and a drain electrode 318 and a source electrode 320 made of metal or the like.

The p+ contact 310 and the n+ source 306 are separated from the drain 308 with the gate 316 interposed therebetween, and a portion of the deep n-well 320 between the gate 316 and the drain 308 corresponds to the drift region of the LDMOS device.

In accordance with embodiments of the invention, the field oxide film 312 is formed through an oxidation process. For example, a LOCOS oxide film may be used. Moreover, the source 306 includes a protruding source fingertip 306t in the central portion thereof, and the drain 308 is formed to surround the source 306.

In the LDMOS device having the above-described structure, a phenomenon occurs in which an electric field concentrates on the drift region between the source fingertip 306t and the drain 308, thereby causing a breakdown current. In accordance with embodiments, in order to prevent this phenomenon, a plurality of p-type internal field rings 322 having a doping type opposite to the doping type of the drift region are formed below the field oxide film 312.

A process for forming the internal field rings 322 will be described. First, an ion implantation mask for forming a drift region is formed, n-type impurity ions are implanted, and a first oxidation process is performed using the ion implantation mask to form an oxide film in a portion corresponding to the drift region. A p-type impurity ion implantation process, for example, a blanket ion implantation process, is performed on the substrate 300 with the oxide film 300 formed to form the internal field rings 322. Meaning, with the blanket ion implantation process, while the p-type impurity ions are not implanted into a portion where the oxide film is formed, the p-type impurity ions are implanted into a portion where no oxide film is formed, such that the internal field rings 322 having an opposite type are formed in the drift region.

Next, the oxide film is removed, and a second oxidation process is performed to form the field oxide film 312. At this time, as the oxide film is removed, a portion where the field oxide film 312 will be formed has a predetermined step, and with this step, the field oxide film 312 which is formed through a second oxidation process has a predetermined step.

Accordingly, in accordance with embodiments of the invention, the internal field rings 322 are separated from each other at predetermined intervals and formed below the field oxide film 312, and the field oxide film 312 has a predetermined step difference. In this way, the internal field rings 322 are formed in the drift region through the blanket ion implantation process, thereby increasing a breakdown voltage without needing a process for forming an additional ion implantation mask and without causing an increase in the radius of curvature between the source fingertip 306t and the drain 308.

A process for manufacturing an internal field ring will be described with reference to example FIGS. 5A to 5F.

Example FIGS. 5A to 5F illustrate process cross-sectional views of a process for manufacturing an LDMOS device in accordance with embodiments of the invention.

Figure 5A:
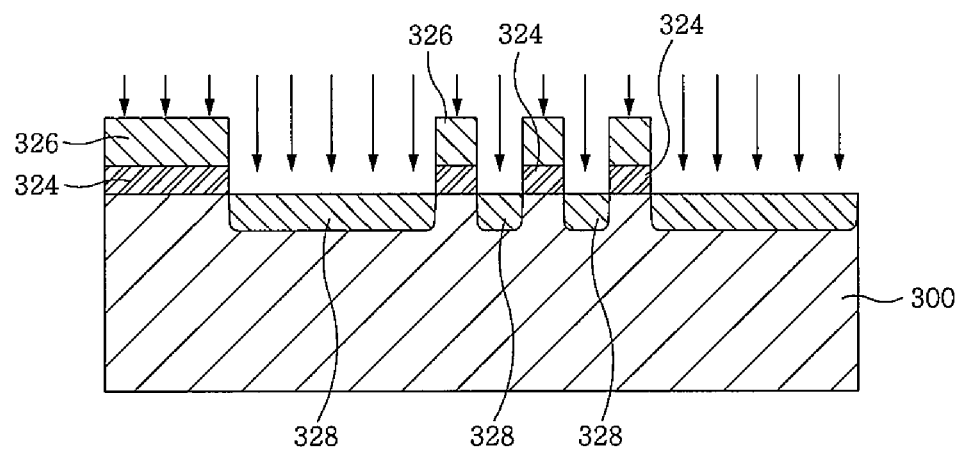

As illustrated in example FIG. 5A, a process for implanting n-type high-concentration impurity ions is first performed to form the deep n-well 302 in the p-type substrate or the p-type SOI substrate 300 as the drift region of the LDMOS device. Specifically, an insulating film 324, for example, a silicon nitride is formed on and/or over the substrate 300, and a photoresist pattern 326 is formed to define a region of the insulating film 324 where n-type high-concentration impurity ions will be implanted. The insulating film 324 is then etched with the photoresist pattern 326 as an etching mask to expose a portion of the substrate 300. Next, a process for implanting n-type high-concentration impurity ions is performed with the photoresist pattern 326 and the etched insulating film 324 as an ion implantation mask to form n-type impurity regions 328 in the substrate 300. A region which is not exposed through the etching insulating film 324 is a portion where the internal field rings 322 will be formed and a portion where the p-body 304 will be formed. Meaning, the insulating film 324 is etched such that a portion where the field oxide film 312 will be formed between the gate 316 and the drain 308 is partially exposed to expose the drift region.

Figure 5B:
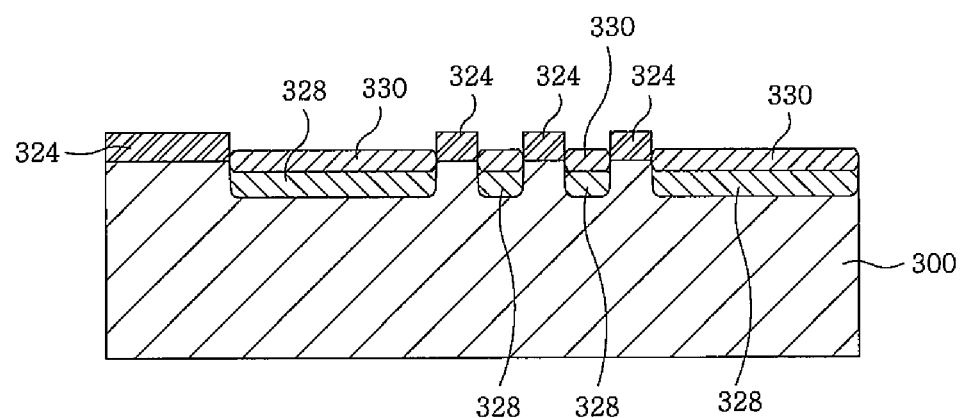

As illustrated in example FIG. 5B, the photoresist pattern 326 is then removed, and the first oxidation process is performed with the etched insulating film 324 as a mask to form a first oxide film 330 on and/or over the substrate 300 exposed through the etched insulating film 324.

Figure 5C:
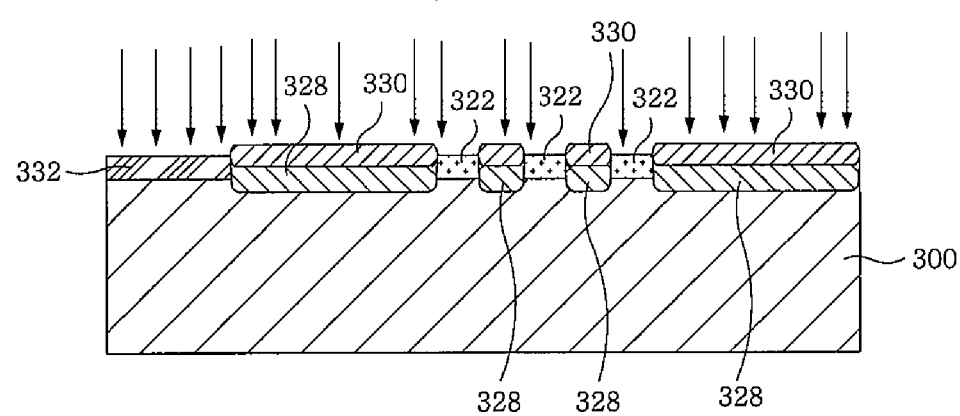

As illustrated in example FIG. 5C, the etched insulating film 324 is then removed, and a blank p-type impurity ion implantation process is performed to form p-type impurity regions 332 in a portion where the internal field rings 322 will be formed and a portion where the p-body 304 will be formed. At the time of the blanket ion implantation process, p-type impurity ions are not implanted into the n-type impurity region 328 due to the first oxide film 330.

Figure 5D:
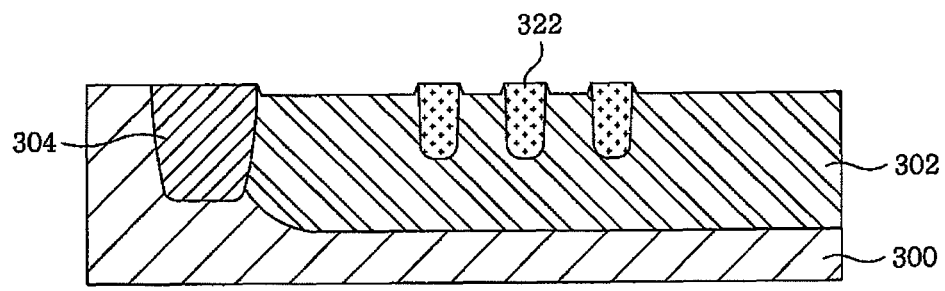

As illustrated in example FIG. 5D, the first oxide film 330 is then removed, and a thermal process is performed to form the internal field rings 322, the p-body 304, and the deep n-well 302 serving as the drift region. A portion where the first oxide film 330 has a predetermined step.

In accordance with embodiments, the method of manufacturing an LDMOS device formation of the internal field rings 322 in the drift region between the source fingertip 306t and the drain 308, the p-body 304, and the deep n-well 302 serving as the drift region can be done through two ion implantation processes, thereby reducing the overall number of processes of the semiconductor device.

The internal field rings 322 having an impurity different from the n-type impurity are formed in the drift region, thereby increasing a breakdown voltage without causing an increase in the area. The breakdown voltage of the LDMOS device in accordance with embodiments can be determined by adjusting the depth and width of the internal field rings 322. Meaning, the depth and width of the internal field rings 322 can be adjusted by adjusting the amount of ion implantation and ion energy at the time of the p-type impurity ion implantation process.

Figure 5E:
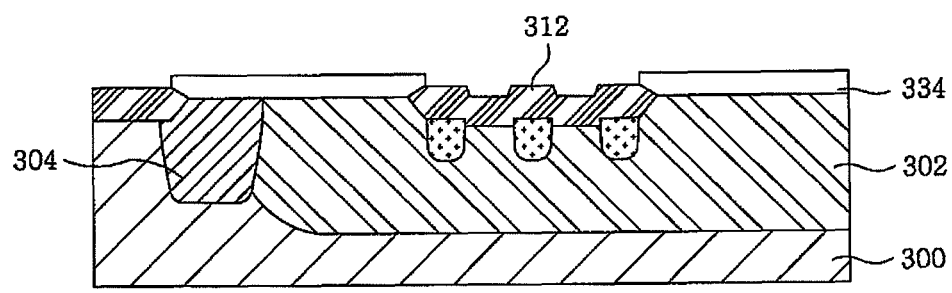

As illustrated in example FIG. 5E, next a field region is defined, the silicon nitride 334 is etched, and a second oxidation process is performed to grow the field oxide film 312 in the drift region. The second oxidation process may be a LOCOS process. The field oxide film 312 which is formed in the drift region has a step due to a step when the first oxide film 330 is removed.

Figure 5F:
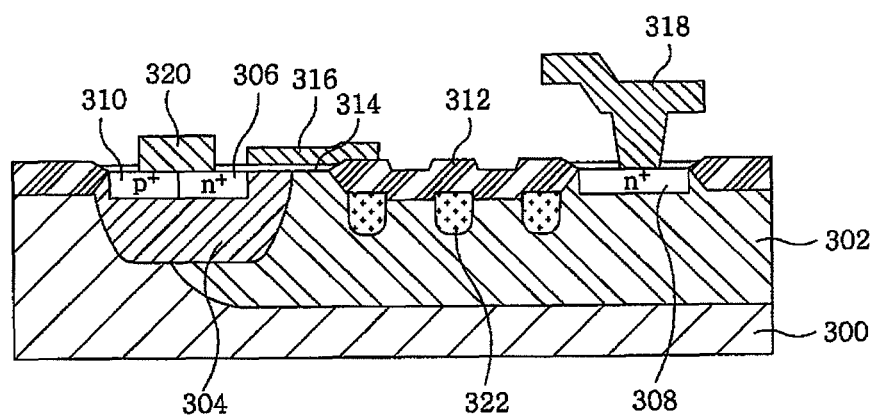

As illustrated in example FIG. 5F, next the silicon nitride 334 is removed, the gate oxide film 314 is grown, and polysilicon is deposited at a prescribed thickness and etched to form the gate 316. Next, an n-type impurity ion implantation process for forming the n+ source 306 and the drain 308, that is, a p-type impurity ion implantation process for forming the p+ contact 310 which comes into contact with the body is performed and activated through a thermal process. Next, similarly to the CMOS process, an insulating interlayer deposition and metal wire process is performed to form the source electrode 320 and the drain electrode 318, thereby completing the LDMOS device.

In accordance with embodiments, the method of manufacturing an LDMOS device at least one internal field ring 322 may be formed in the drift region between the source fingertip 306t and the drain 308, thereby increasing a breakdown voltage without causing an increase in the radius of curvature. The source fingertip 306t is used as a channel, thereby decreasing specific on-resistance Rsp.

Although embodiments have been described, it should be understood that numerous other modifications and embodiments can be devised by those skilled in the art that fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the components parts and/or arrangements, alternative uses will also be apparent to those skilled in the art.

What is claimed is:

1. A method of manufacturing an LOMOS device which has a source and a drain arranged to be separated from each other on both sides of a substrate with a gate interposed there between, the method comprising:
   implanting first conduction type impurity ions into the first regions of the substrate forming first conduction type impurity regions in the substrate, wherein a second region of the substrate remains undoped and the undoped second region includes a first portion on which the source is to be formed and at least one second portion positioned between the first portion and a on which the drain is to be formed;
   forming an oxide film on the first regions of the substrate through an oxidation process;
   performing an impurity implantation process with the oxide film as an ion implantation mask to implant second conduction type impurity ions into the second region forming a second conduction type impurity region at the first portion and at least one second conduction type impurity ring at the at least one second portion;
   removing the oxide film and performing a thermal process on the semiconductor substrate,
   forming
   i) a first conduction type deep well serving as a drift region of the LOMOS device from the first conduction type impurity region in the substrate,
   ii) a second conduction type well connected to the drift region from the a second conduction type impurity region at the first portion, and
   iii) at least one internal field ring in the drift region from the at least one second conduction type impurity ring at the at least one second portion;
   and then forming a field oxide film on the substrate above the at least one internal field ring.

2. The method of claim 1, wherein the step of implanting the first conduction type impurity ions comprises:
   forming an insulating film over the substrate,
   forming a photoresist pattern over the substrate;
   patterning the insulating film exposed through the photoresist pattern,
   implanting the first conduction type impurity ions,
   and then removing the photoresist pattern.

3. The method of claim 2, wherein the insulating film is a silicon nitride.

4. The method of claim 2, wherein, in the step of forming the oxide film, an oxidation process is performed using the patterned insulating film to form the oxide film.

5. The method of claim 4, wherein, in the step of implanting the second conduction type impurity ions, the patterned insulating film is removed and the second conduction type impurity ions are implanted through an impurity ion implantation process with the oxide film as an ion implantation mask.

6. The method of claim 5, wherein the insulating film is a silicon nitride.

7. The method of claim 1, wherein, in said forming at least one internal field ring in the drift region, the internal field ring is formed below the field oxide film formed between a source fingertip portion of the source and the drain.

8. The method of claim 1, wherein, in said implanting the second conduction type impurity ions, a dosage amount of the second conduction type impurity ions or an ion implantation energy is controlled to control the concentration in the drift region.

9. The method of claim 1, wherein, in said forming the field oxide film, the field oxide film is formed through a Local Oxidation of Silicon process.

10. The method of claim 1, wherein the at least one internal field ring includes a plurality of internal field rings spaced apart from each other under the field oxide film.

* * * * *